(12) United States Patent
Kao et al.

(10) Patent No.: US 6,414,869 B1
(45) Date of Patent: Jul. 2, 2002

(54) QUAD IN-LINE MEMORY MODULE

(75) Inventors: David Y. Kao, Meridian; Tongbi Jiang, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 148 days.

(21) Appl. No.: 09/614,639

(22) Filed: Jul. 12, 2000

Related U.S. Application Data

(63) Continuation of application No. 08/982,930, filed on Dec. 2, 1997, now Pat. No. 6,108,228.

(51) Int. Cl.$^7$ ................................................ G11C 5/06
(52) U.S. Cl. ............................................. 365/52; 710/102
(58) Field of Search ............................ 361/684, 803, 361/785, 788, 728, 730, 736, 737; 365/51, 52; 710/102

(56) References Cited

U.S. PATENT DOCUMENTS

| | | | | |
|---|---|---|---|---|
| 5,181,167 A | * | 1/1993 | Davidson et al. ........... 361/684 |
| 5,513,135 A | * | 4/1996 | Dell et al. ..................... 365/52 |
| 5,532,954 A | * | 7/1996 | Bechtolsheim et al. ....... 365/52 |
| 5,745,426 A | * | 4/1998 | Sekiyama .................... 365/226 |
| 5,748,912 A | * | 5/1998 | Lee .............................. 395/282 |
| 5,758,100 A | * | 5/1998 | Odisho ........................ 395/282 |
| 5,790,447 A | * | 8/1998 | Laudon et al. ................. 365/52 |
| 6,097,883 A | * | 8/2000 | Dell et al. ................... 395/282 |

* cited by examiner

Primary Examiner—Lynn D. Feild
(74) Attorney, Agent, or Firm—Trop, Pruner & Hu P.C.

(57) ABSTRACT

A quad in-line memory module (QIMM) includes a circuit board having top and bottom edge connectors and a number of memory devices mounted on each side of the circuit board. Generally, half of the memory devices are electrically connected to the bottom edge's connector and half are electrically connected to the bottom edge's connector. One edge of the QIMM can be connect directly to a computer system's memory bus. The other edge can be connected to operated as a cache memory or a video memory.

11 Claims, 5 Drawing Sheets

QUAD IN-LINE MEMORY MODULE

This is a continuation of prior application Ser. No. 08/982,930 filed Dec. 2, 1997 now U.S. Pat. No. 6,108,288.

BACKGROUND OF THE INVENTION

The invention relates to the field of computer systems and memory hardware and, more particularly, to a quad in-line memory module having connectors along two long edges of the module's circuit board.

Single and dual in-line memory modules (SIMMs and DIMMs respectively) have been developed to provide a convenient means of organizing memory for use in computer systems. SIMMs and DIMMs are compact circuit boards, typically 10 cm×2 cm, with integrated circuit memory chips mounted on one or both sides of the board and electrical connectors along one edge of the board. SIMMs have a row of connectors along one side of one edge of the memory module's circuit board. DIMMs have connectors along both sides of one edge of the memory module's circuit board.

FIG. 1 illustrates a computer system 100 in which SIMMs and DIMMs can be used and includes a central processing unit (CPU) 105, system memory 110, a video controller card 115 and display 120, a disk controller card 125 and disk drive 130, a system bus 135 used to communicate data and control signals between the computer system's 100 different components, a bridge circuit 140 used to couple the system bus 135 to a secondary bus 145, input/output (I/O) control circuitry 150, serial 155 and parallel 160 I/O ports, a keyboard 165, and one or more slots 170 through which additional devices such as an audio card could be connected. Some or all of the elements shown in FIG. 1 may be positioned on the computer system's 100 main circuit board (motherboard). It will be recognized that the system bus could be a Peripheral Component Interconnect (PCI) bus and the secondary bus 145 could be an expansion bus such as the Industry Standard Architecture (ISA) bus or the Extended Industry Standard Architecture (EISA) bus.

SIMMs and DIMMs are generally mounted with their circuit boards at a right angle to the computer system's motherboard and populated with dynamic random access memory (DRAM), static random access memory (SRAM), or video random access memory (VRAM) chips. When DRAMs are used the SIMM/DIMM can be used to implement system memory 110. When SRAMs are used the SIMM/DIMM can implement a cache 175 such as found in a disk controller card 125. When VRAMs are used the SIMM/DIMM can implement video memory 180 such as found in a video controller card 115.

SUMMARY OF THE INVENTION

A quad in-line memory module composed of a circuit board having top and bottom connectors and a number of memory devices mounted on one or both sides of the circuit board is described. The memory devices may be mounted onto the circuit board via any convenient technique such as surface mount or flip-chip. Additionally, packaged memory devices (e.g., dual in-line packages or DIPs) may also be mounted on the circuit board. Mounted devices may be electrically coupled to the top and bottom edge connectors via conductive paths both on the surface of the circuit board and between the circuit board's top and bottom surfaces.

A quad in-line memory module in accordance with the invention can provide one or more of the following advantages: (1) increase chip density in a given computer system without requiring additional motherboard area; (2) simplify routing of conductive paths in a memory module for a given number of chips; (3) provide wider data paths to/from a memory module; and (4) reduce line density for a given size of memory module.

DESCRIPTION OF THE PREFERRED EMBODIMENTS

The embodiments of a quad in-line memory module (QIMM) described herein are intended to be illustrative only. It will be apparent to those skilled in the art that the details disclosed below can or may be changed without departing from the inventive concept.

Figure 1:
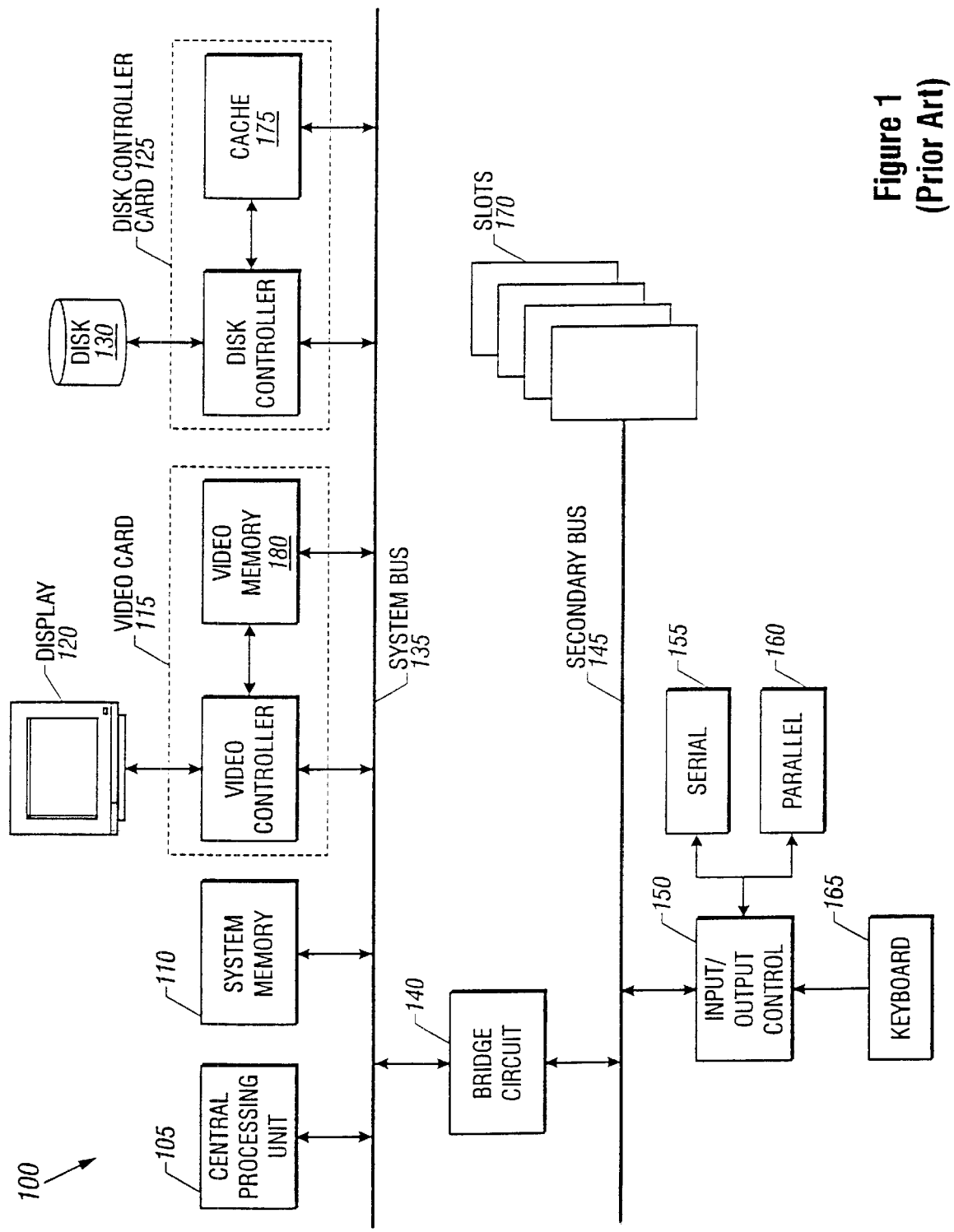
FIG. 1 illustrates a computer system.
Figure 2:
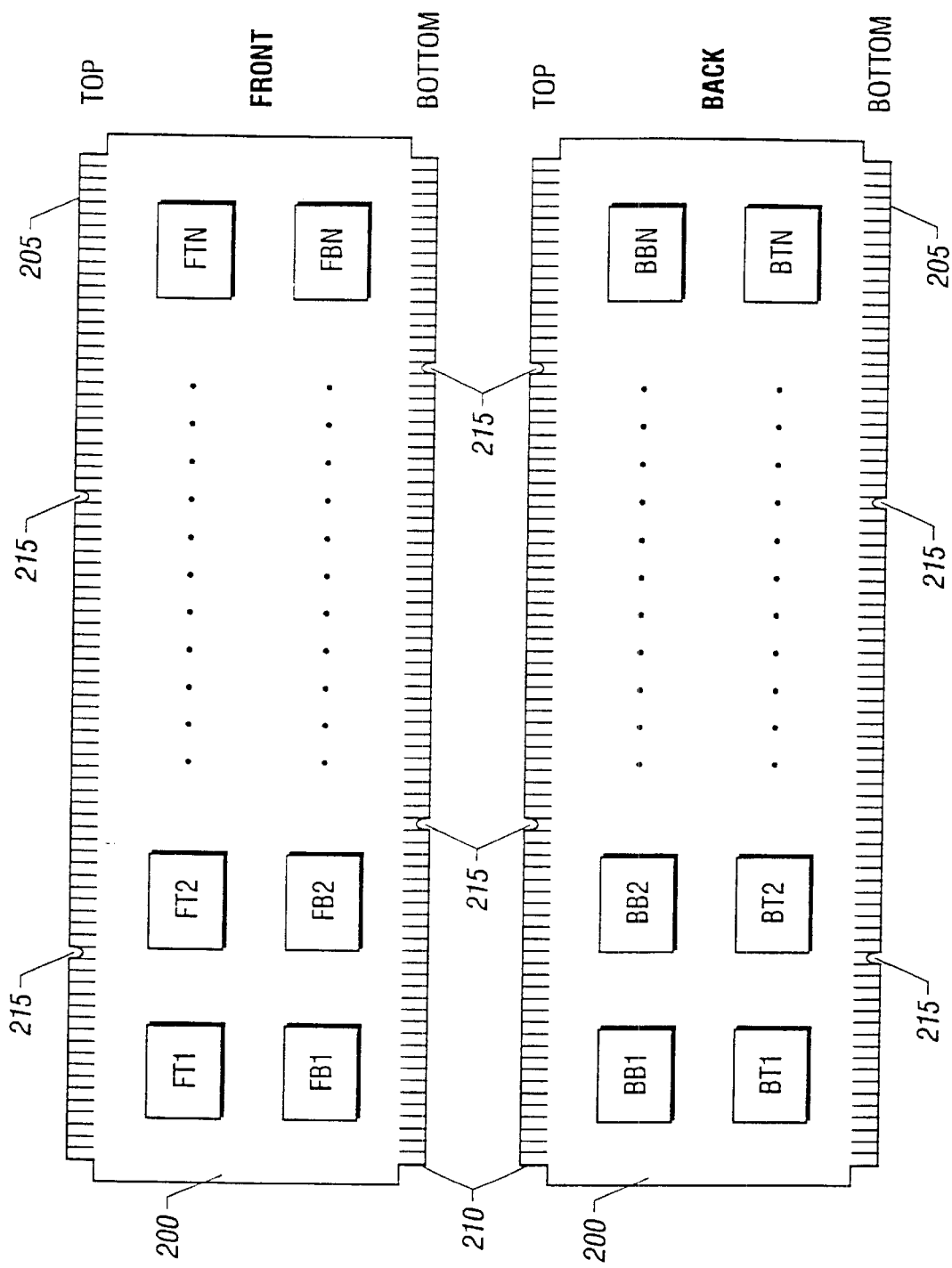
FIG. 2 shows a quad in-line memory module (QIMM) having two rows of memory devices on each side of its circuit board.

As shown in FIG. 2, a quad in-line memory module (QIMM) includes a circuit board 200 having top connector tabs 205, bottom connector tabs 210, alignment slots 215, and a number of memory devices such as front-top 1 (FT1) and back-bottom 2 (BB2). Each of the top memory devices FT1 through FTN and BT1 through BTN are connected through conductive paths to the top connector tabs 205. Each of the bottom memory devices FB1 through FBN and BB1 through BBN are connected through conductive paths to the bottom connector tabs 210. Conductive paths from the QIMM's memory devices to the edge connectors can be on the surface of the circuit board 200 and/or through conductive layers within the circuit board 200. If connections are made by layers within the circuit board 200, vias must be provided to mechanically link the memory devices to the appropriate conductive layer and connector tab. One edge of the QIMM (for example the bottom edge) can plug into a socket connected directly to a computer system's main memory bus while the other edge (the top) can be connected to another component in the computer system through any convenient means such as a flex connector cable. Thus, the QIMM's bottom connector can plug directly into a computer system's system bus while its top connector could plug into the computer system's video bus, or into a SRAM bus to provide disk cache memory. For ease of use within existing computer systems one, or both, of a QIMM's connector tabs (205 and 210) can form a standard 168 contact connector.

In one embodiment, edge connectors 205 and 210 are gold coated and the circuit board is composed of an epoxy based compound known as FR4 and/or BT resin (bismaleimide triazine). Memory devices may be mounted on the QIMM's circuit board 200 using surface mount or flip-chip technology or any other suitable means capable of mechanically coupling the devices to the board. Memory devices encapsulated within packaged chips may also be mounted on the QIMM's circuit board.

Figure 3:
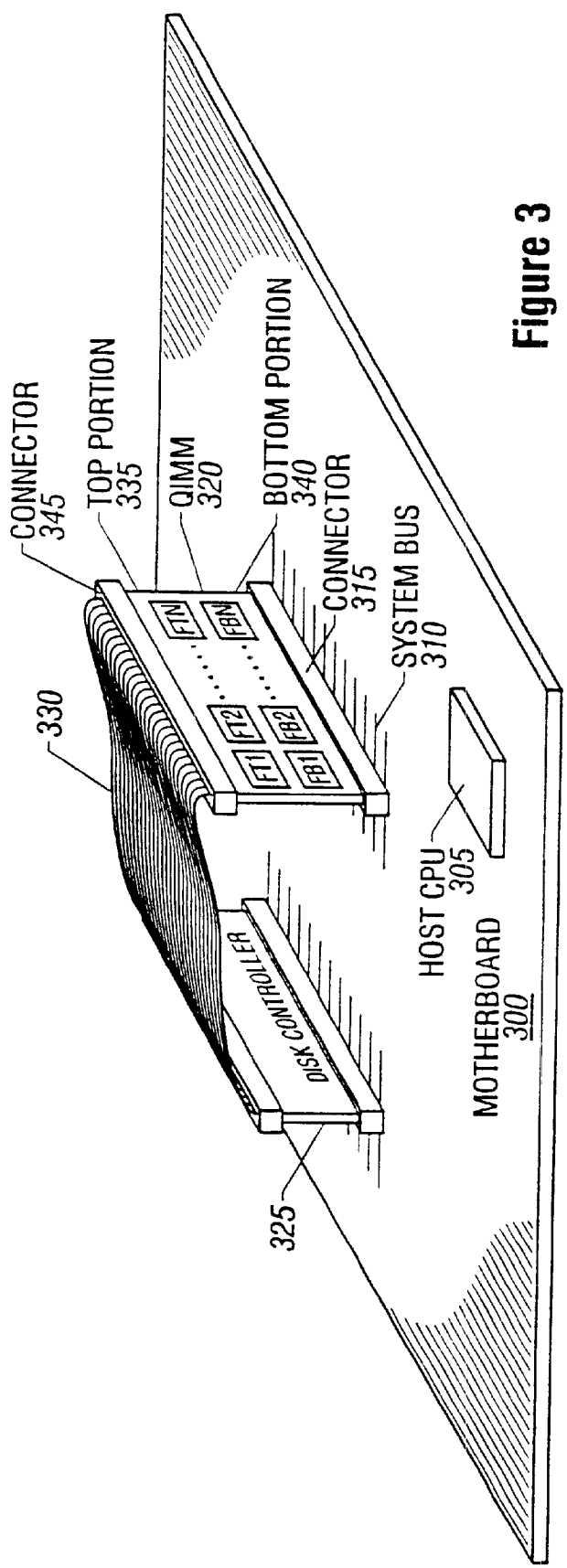
FIG. 3 illustrates how a QIMM could be used to simultaneously implement a disk controller cache and system memory.
Figure 4:
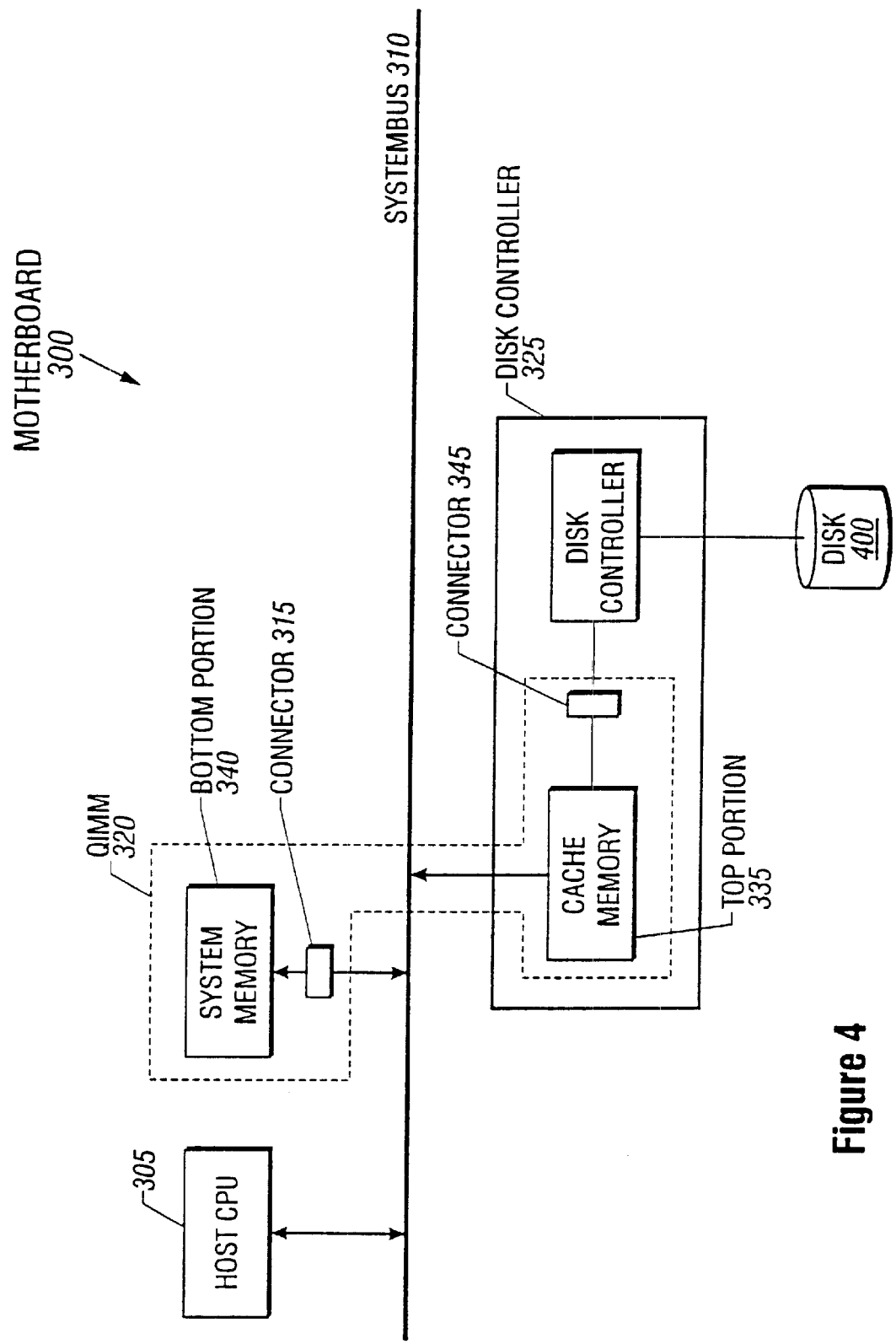
FIG. 4 is a block diagram representation of FIG. 3.

In the embodiment shown in FIG. 3, a computer system's motherboard 300 includes a host CPU 305, a system bus 310, a connector 315 connected to at least a part of the system bus 310, a QIMM 320, a disk controller card 325, and a connective cable 330. The QIMM's bottom row of conductor tabs are connected, via connector 315, to the system bus. The QIMM's top row of connector tabs are connected to the disk controller 325 via connector 345 and cable 330. The QIMM 320 has SRAM devices on its top portion 335 (i.e., FT1 through FTN and BT1 through BTN) and DRAM devices on its bottom portion 340 (i.e., FB1 through FBN and BB1 through BBN). A block diagram representation of FIG. 3's embodiment is shown in FIG. 4. (FIG. 4 includes a disk 400 not shown in FIG. 3.) In this configuration, a single quad in-line memory module can implement both system memory and disk cache memory. Alternatively, the QIMM's SRAM could be replaced with VRAM which could then be connected to a video controller.

In another embodiment, a QIMM's bottom portion could be populated with SRAM and its top portion with VRAM. The QIMM could them be used to implement both a cache memory and a video memory. In yet another embodiment, a QIMM can be populated with a single type of memory device (e.g., all SRAM or all DRAM). Here, the QIMM can be used in a system having double the data bus width of a system that uses standard DIMMs and four times the bus width of a system using standard SIMMs.

Figure 5:
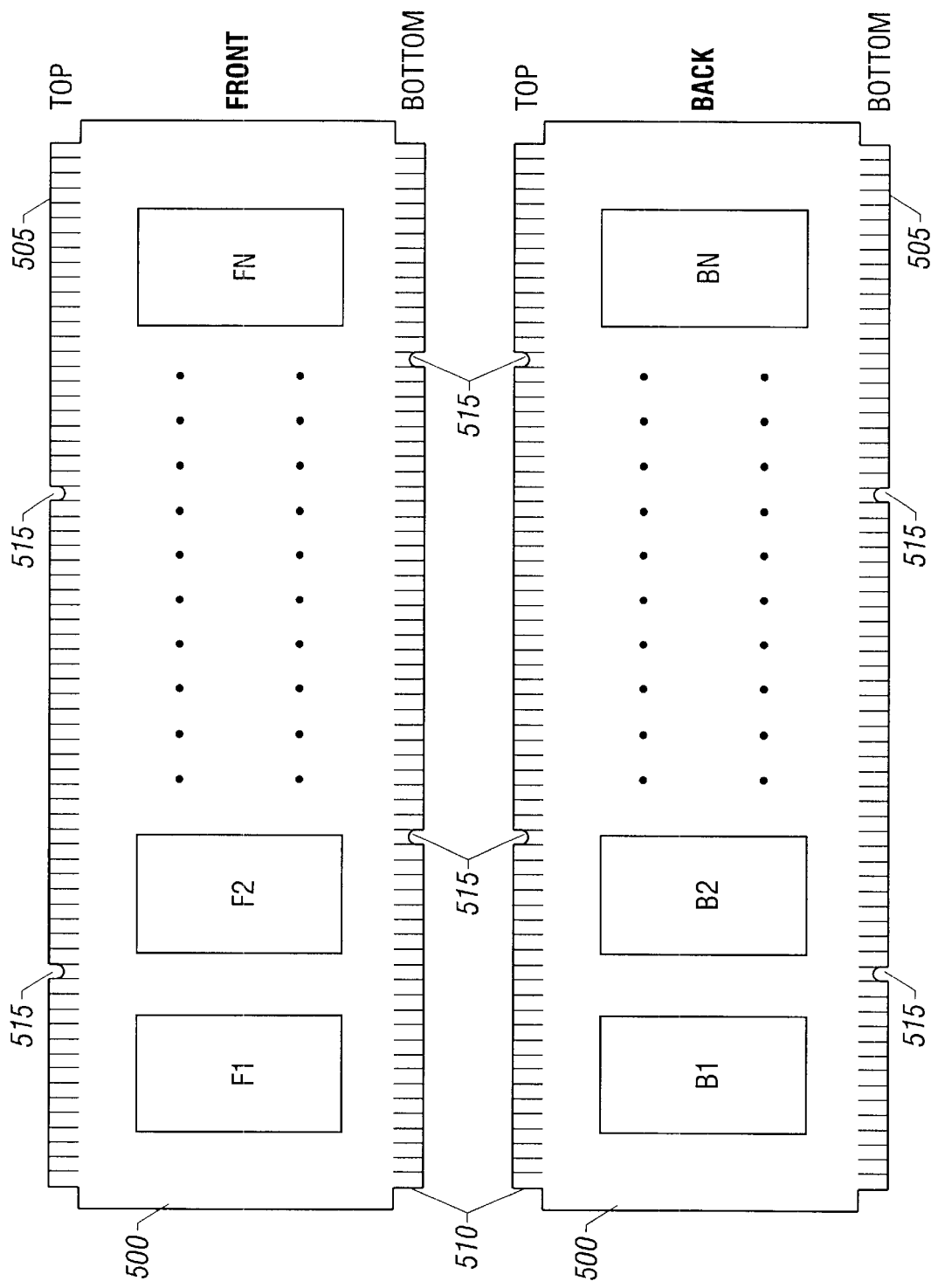
FIG. 5 shows a QIMM having a single row of memory devices on each side of its circuit board.

In the embodiment shown in FIG. 5, a QIMM includes a circuit board 500 having top connector tabs 505, bottom connector tabs 510, alignment slots 515, and a single row of memory devices on each side of the circuit board 500 such as front 1 (F1) and back 2 (B2). Half of the QIMM's memory devices, for example all those on the front side of the circuit board 500, are connected through conductive paths to the top connector tabs 505, and the other half to the bottom connector tabs 510. Alternatively, integrated circuits could be mounted to only a single side of the circuit board while still utilizing both the top and bottom edge connectors. In these embodiments, the density of the conductive paths on, and within, the circuit board 500 are reduced over SIMM/DIMM designs making the QIMM's layout simpler, less costly, and less prone to manufacturing error. Another benefit of this embodiment is that the number of layers needed in the circuit board 500 to carry conductive paths can be reduced compared to SIMM/DIMM designs having the same number and type of memory devices. This too can reduce the cost and complexity of the memory module.

What is claimed is:

1. A memory module comprising:
   a circuit board having a front side, a back side, a bottom edge having an exposed bottom connector, and a top edge having an exposed top connector;
   first and second memory devices mounted on the front side and the back side; and
   a conductive path operatively coupling the first memory device to the bottom connector and the second memory device to the top connector, said conductive path to couple external devices to said top and bottom connectors at the same time so that said circuit board communicates with two external devices.

2. The memory module of claim 1 wherein at least one of the memory devices is a dynamic random access memory integrated circuit.

3. The memory module of claim 1 wherein at least one of the memory devices is a static random access memory integrated circuit.

4. The memory module of claim 1 wherein at least one of the memory devices is a video random access memory integrated circuit.

5. The memory module of claim 1 wherein all of the memory devices are a single type of integrated memory circuit.

6. The module of claim 1 wherein at least one of the memory devices is mounted onto the circuit board by the surface mount technique.

7. The memory module of claim 1 wherein at least one of the memory devices is a packaged integrated circuit.

8. The memory module of claim 1 wherein at least one of the conductive paths are between the circuit board's front and back sides.

9. The memory module of claim 1 further comprising alignment notches in both the top edge and the bottom edge.

10. The memory module of claim 1 wherein the bottom connector comprises 84 connector tabs on the bottom edge's front side and 84 connector tabs on the bottom edge's back side.

11. The memory module of claim 1 wherein the top connector comprises 84 connector tabs on the top edge's front side and 84 connector tabs on the top edge's back side.

* * * * *